United States Patent
Su et al.

(10) Patent No.: US 12,181,496 B2
(45) Date of Patent: Dec. 31, 2024

(54) CANTILEVER PROBE CARD AND PROBE MODULE THEREOF

(71) Applicant: CHUNGHWA PRECISION TEST TECH. CO., LTD., Taoyuan (TW)

(72) Inventors: Wei-Jhih Su, Taichung (TW); Chao-Hui Tseng, New Taipei (TW); Hao-Yen Cheng, Taoyuan (TW); Rong-Yang Lai, Taoyuan (TW)

(73) Assignee: CHUNGHWA PRECISION TEST TECH. CO., LTD., Taoyuan (TW)

( * ) Notice: Subject to any disclaimer, the term of this patent is extended or adjusted under 35 U.S.C. 154(b) by 170 days.

(21) Appl. No.: 17/981,463

(22) Filed: Nov. 6, 2022

(65) Prior Publication Data
US 2023/0349953 A1  Nov. 2, 2023

(30) Foreign Application Priority Data
Apr. 29, 2022 (TW) .................................. 111116375

(51) Int. Cl.
*G01R 1/073* (2006.01)
*G01R 1/067* (2006.01)

(52) U.S. Cl.
CPC ...... *G01R 1/07342* (2013.01); *G01R 1/06711* (2013.01)

(58) Field of Classification Search
CPC ............ G01R 1/07342; G01R 1/06711; G01R 1/06727
See application file for complete search history.

(56) References Cited

U.S. PATENT DOCUMENTS

| 2003/0214045 A1* | 11/2003 | Lahiri | ................. H01L 21/4853 257/761 |
| 2009/0072850 A1* | 3/2009 | Ismail | ................ G01R 1/06727 324/755.07 |
| 2015/0168483 A1* | 6/2015 | Kim | ..................... G01R 1/0408 324/754.08 |
| 2017/0054240 A1* | 2/2017 | Lee | .......................... G01R 1/02 |

FOREIGN PATENT DOCUMENTS

JP  2011112517 A  *  6/2011

* cited by examiner

*Primary Examiner* — Dominic E Hawkins
(74) *Attorney, Agent, or Firm* — Li & Cai Intellectual Property Office

(57) ABSTRACT

A cantilever probe card and a probe module thereof are provided. The probe module includes a supporting board, a substrate disposed on the supporting board, a plurality of cantilever probes, and a plurality of fine adjustment members. The substrate has a non-planar shape and has a difference of warpage along a testing direction. One end of each of the cantilever probes is connected to the substrate, and another end of each of the cantilever probes is a free end. The fine adjustment members are spaced apart from each other and are disposed between the supporting board and the substrate. Each of the fine adjustment members is configured to be independently operable along the testing direction for changing a distance between the supporting board and the substrate. The substrate is deformable through at least one of the fine adjustment members so as to reduce the difference of warpage.

10 Claims, 15 Drawing Sheets

CANTILEVER PROBE CARD AND PROBE MODULE THEREOF

CROSS-REFERENCE TO RELATED PATENT APPLICATION

This application claims the benefit of priority to Taiwan Patent Application No. 111116375, filed on Apr. 29, 2022. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a probe card, and more particularly to a cantilever probe card and a probe module thereof.

BACKGROUND OF THE DISCLOSURE

Improvements for a conventional cantilever probe card are aimed at making needle tips of all cantilever probes be coplanar with each other, but certain factors may exist in any component of the conventional cantilever probe card that preclude the achievement of this aim (e.g., a substrate of the conventional cantilever probe card for carrying the cantilever probes having a warpage).

SUMMARY OF THE DISCLOSURE

In response to the above-referenced technical inadequacies, the present disclosure provides a cantilever probe card and a probe module thereof to effectively improve on the issues associated with conventional cantilever probe cards.

In one aspect, the present disclosure provides a cantilever probe card, which includes a carrier having a carrying surface and a plurality of probe modules that are disposed on the carrying surface of the carrier and that are spaced apart from each other. Each of the probe modules includes a supporting board, a substrate, a plurality of cantilever probes, and a plurality of fine adjustment members. The supporting board is assembled to the carrying surface. The substrate is disposed on the supporting board. The substrate has a non-planar shape and has a difference of warpage along a testing direction. One end of each of the cantilever probes is connected to the substrate, and another end of each of the cantilever probes is a needle tip. The fine adjustment members are spaced apart from each other and are disposed between the supporting board and the substrate. Each of the fine adjustment members is configured to be independently operable along the testing direction for changing a distance between the supporting board and the substrate. In each of the probe modules, the substrate is deformable through at least one of the fine adjustment members so as to reduce the difference of warpage of the substrate along the testing direction.

In another aspect, the present disclosure provides a probe module of a cantilever probe card, which includes a supporting board, a substrate disposed on the supporting board, a plurality of cantilever probes, and a plurality of fine adjustment members that are spaced apart from each other and that are disposed between the supporting board and the substrate. The substrate has a non-planar shape and has a difference of warpage along a testing direction. One end of each of the cantilever probes is connected to the substrate, and another end of each of the cantilever probes is a free end. Each of the fine adjustment members is configured to be independently operable along the testing direction for changing a distance between the supporting board and the substrate. The substrate is deformable through at least one of the fine adjustment members so as to reduce the difference of warpage of the substrate along the testing direction.

Therefore, in the probe module or the cantilever probe card provided by the present disclosure, the difference of warpage generated from the non-planar substrate can be effectively reduced through the fine adjustment members each being independently operable, so that the cantilever probes can be assembled to the substrate having more uniform height along the testing direction.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

First Embodiment

Figure 1:
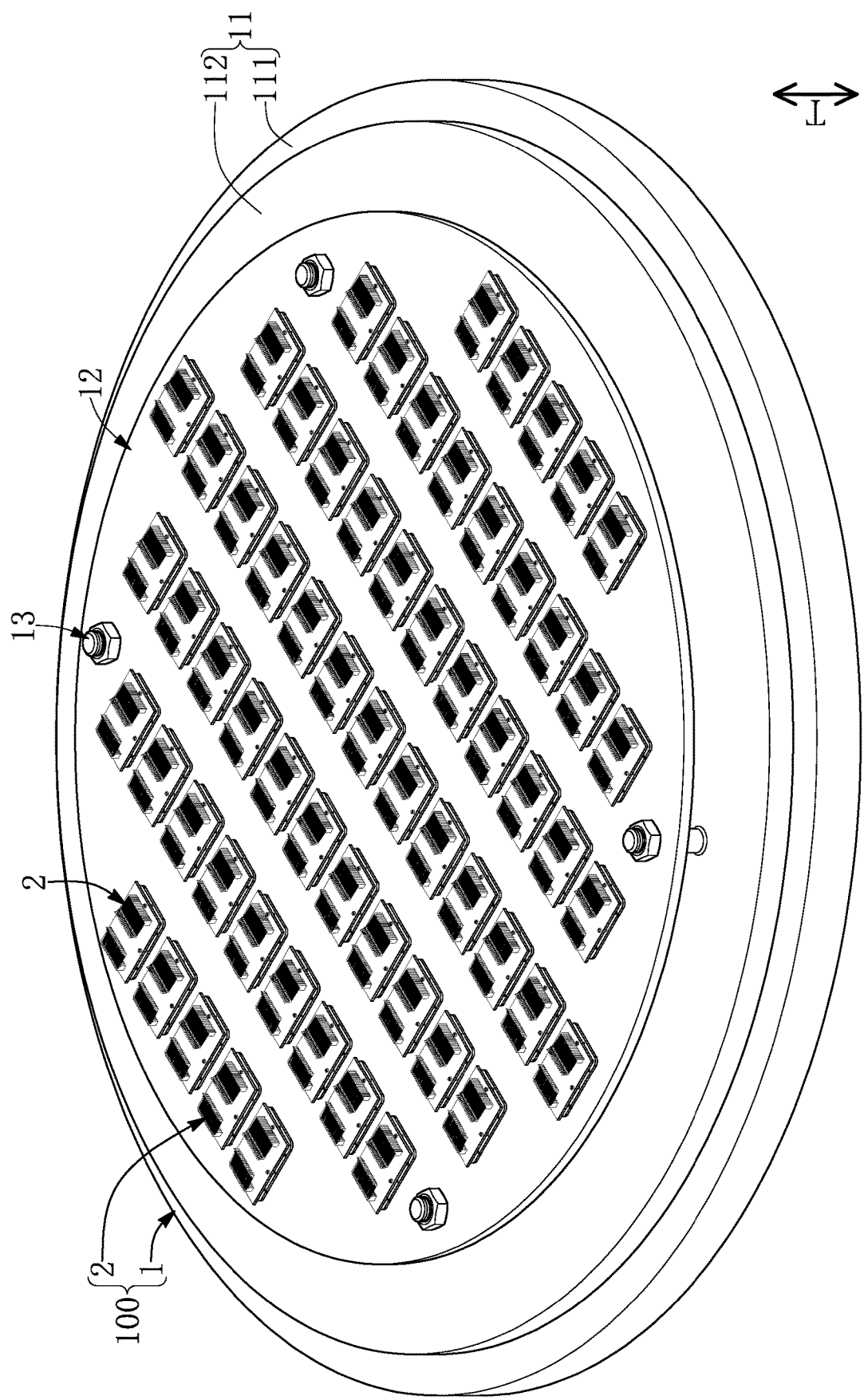
FIG. 1 is a perspective view of a cantilever probe card according to a first embodiment of the present disclosure.
Figure 2:
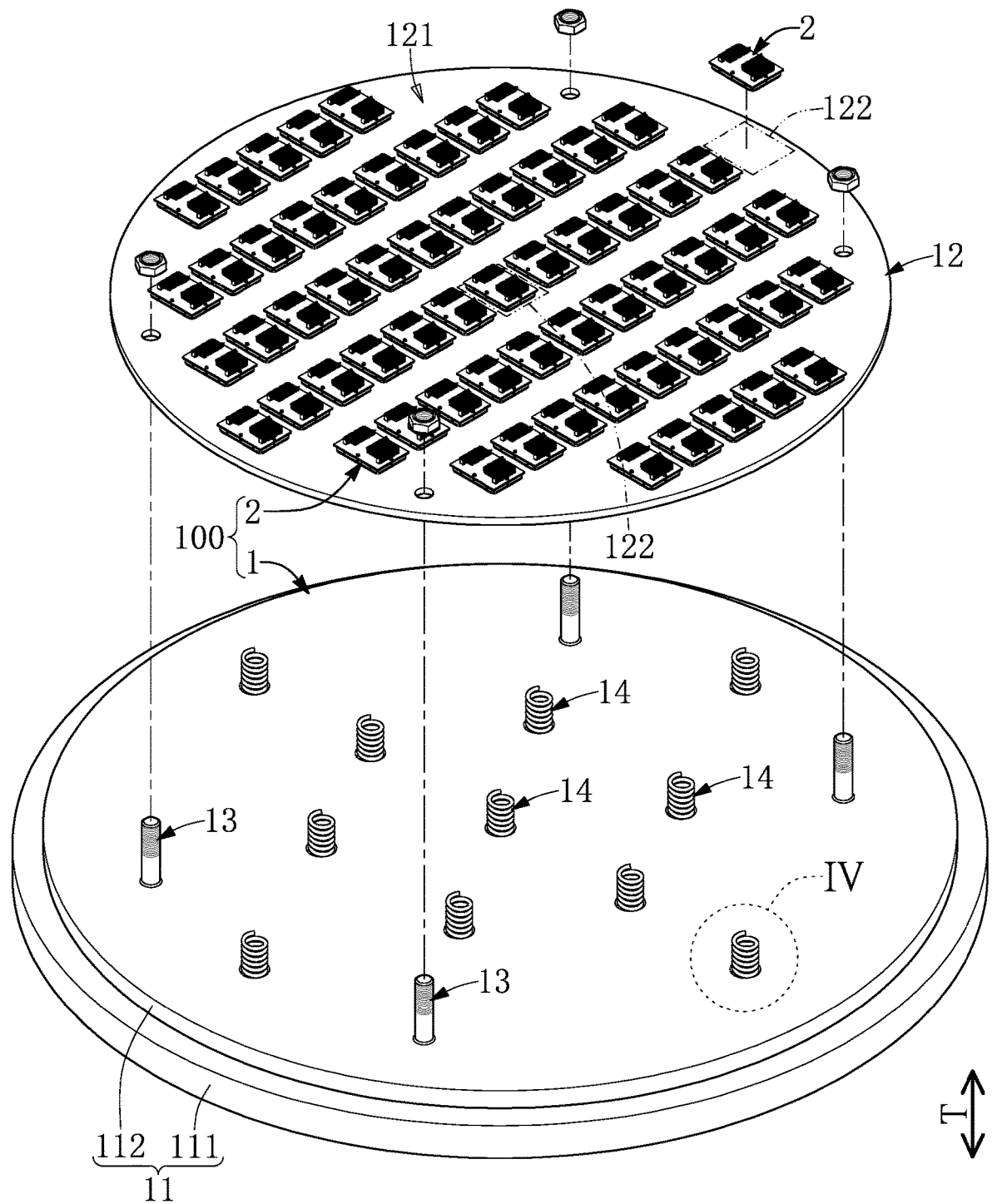
FIG. 2 is an exploded view of FIG. 1.

Referring to FIG. 1 to FIG. 11, a first embodiment of the present disclosure provides a cantilever probe card 100. As shown in FIG. 1 and FIG. 2, the cantilever probe card 100 includes a carrier 1 and a plurality of probe modules 2 that are spaced apart from each other and that are disposed on a carrying surface 121 of the carrier 1. It should be noted that the carrier 1 and the probe modules 2 of the cantilever probe card 100 in the present embodiment are described in cooperation with the each other, but the present disclosure is not limited thereto. For example, in other embodiments of the present disclosure not shown in the drawings, the carrier 1 or any one of the probe modules 2 can be independently used (e.g., sold) or can be used in cooperation with other components.

Figure 3:
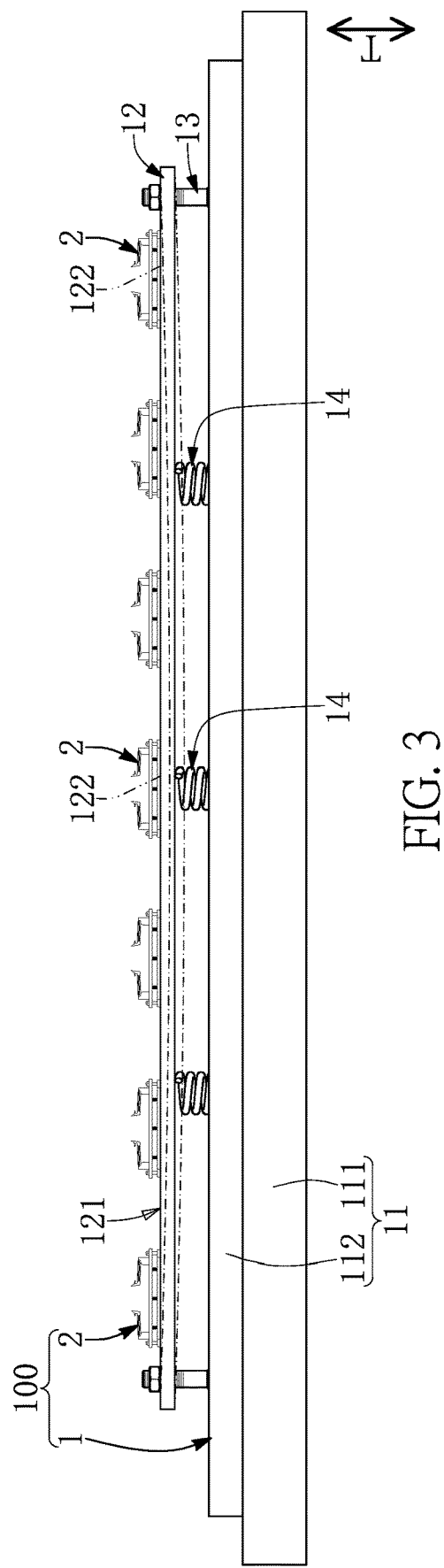
FIG. 3 is a side view of FIG. 1.

As shown in FIG. 2 and FIG. 3, the carrier 1 in the present embodiment includes a seat 11, a metal sheet 12 assembled to the seat 11, a retaining mechanism 13 corresponding in position to the seat 11 and the metal sheet 12, and a plurality of coarse adjustment members 14 that are spaced apart from each other and that are disposed between the seat 11 and the metal sheet 12, but the present disclosure is not limited thereto. For example, in other embodiments of the present disclosure not shown in the drawings, the retaining mechanism 13 can be omitted or can be replaced by other components.

Specifically, the seat 11 in the present embodiment includes a frame 111 and a circuit board 112 that is disposed on the frame 111 and that allows the metal sheet 12 to be assembled thereon, but in other embodiments of the present disclosure not shown in the drawings, the seat 11 can be a single one-piece structure according to design requirements.

Moreover, the carrying surface 121 in the present embodiment is an outer surface of the metal sheet 12 and defines a plurality of assembling regions 122 spaced apart from each other. Furthermore, at least two of the assembling regions 122 (e.g., two of the assembling regions 122 labeled in FIG. 3) have an assembling tolerance (e.g., the carrying surface 12 in FIG. 3 is shown by dotted-lines to have an assembling tolerance, where the carrying surface 12 does not abut against the coarse adjustment members 14) therebetween along a testing direction T (e.g., a normal direction of the carrying surface 121), and the probe modules 2 are respectively disposed on the assembling regions 122 and are spaced apart from each other.

Each of the coarse adjustment members 14 is configured to be independently operable along the testing direction T for changing a distance between the carrying surface 121 and the seat 11. The distance between the carrying surface 121 and the seat 11 can be limited within a predetermined range through the retaining mechanism 13. For example, the retaining mechanism 13 can include a plurality of screws that are assembled to peripheral regions of the seat 11 and the metal sheet 12, so as to only allow the metal sheet 12 to be moved relative to the seat 11 along the testing direction T.

Exemplarily, the coarse adjustment members 14 are uniformly distributed on the metal sheet 12, so that the assembling regions 122 of the metal sheet 12 can be located in a range which can allow the coarse adjustment members 14 to affect or adjust the same.

In summary, the metal sheet 12 of the carrier 1 is deformable through at least one of the coarse adjustment members 14 so as to reduce the assembling tolerance along the testing direction T. For example, at least one of the coarse adjustment members 14 corresponding in position to the assembling tolerance can be adjusted or operated, so that the metal sheet 12 can generate a deformation to reduce the assembling tolerance that exists in the at least two of the assembling regions 122.

As the coarse adjustment members 14 in the present embodiment are of the substantially same structure, the following description discloses the structure of just one of the coarse adjustment members 14 for the sake of brevity, but the present disclosure is not limited thereto. For example, in other embodiments of the present disclosure not shown in the drawings, the coarse adjustment members 14 can be of different structures. Moreover, the coarse adjustment member 14 can be adjusted or changed according to design requirements, and the following description simply describes the coarse adjustment member 14 formed in certain possible structures without limiting the present disclosure.

Figure 4:
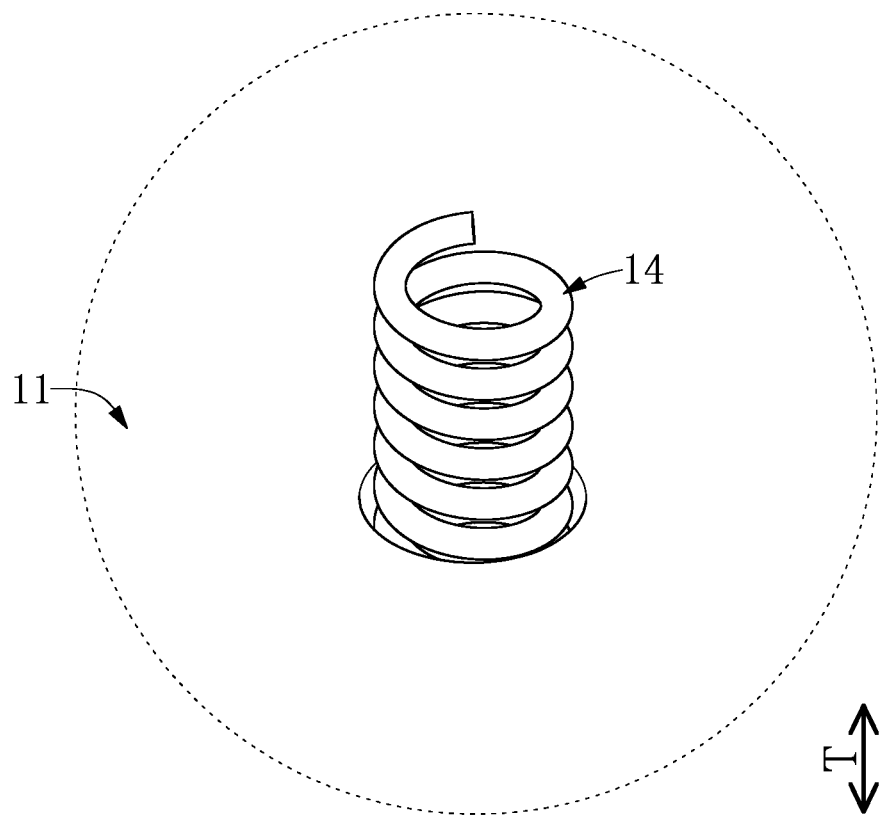
FIG. 4 is an enlarged view of part IV of FIG. 2.
Figure 5:
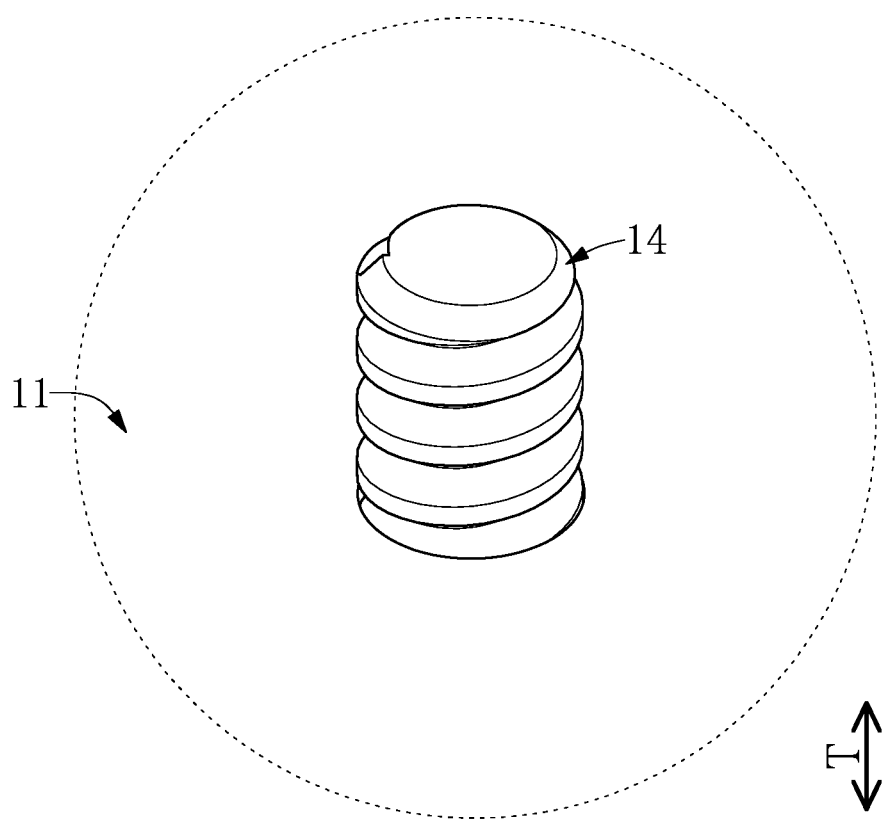
FIG. 5 is a perspective view showing FIG. 4 in another configuration.

As shown in FIG. 2, FIG. 4, and FIG. 5, the coarse adjustment member 14 can be a single one-piece structure, one end of the coarse adjustment member 14 is inserted into the seat 11 along the testing direction T, and another end of the coarse adjustment member 14 abuts against the metal sheet 12 along the testing direction T. The coarse adjustment member 14 can be a spring shown in FIG. 4 for having an auto-adjustment function by an elasticity thereof, or can be a screw shown in FIG. 5 for having an adjustment function by being rotated.

Figure 6:
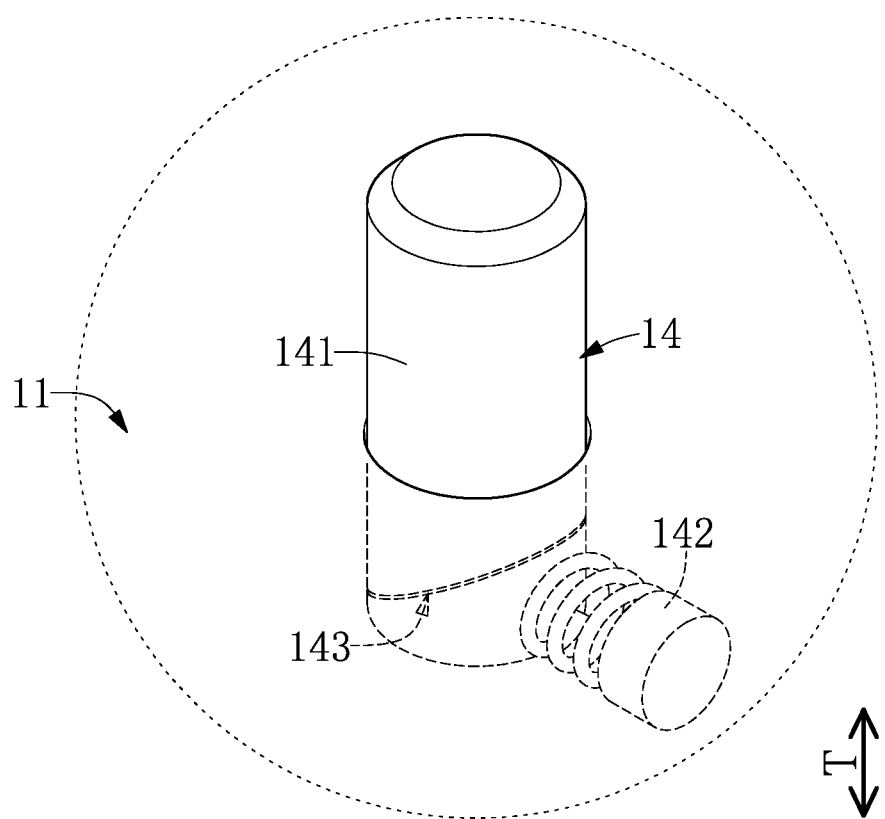
FIG. 6 is a perspective view showing FIG. 4 in still another configuration.

As shown in FIG. 6, the coarse adjustment member 14 can be provided by more than one component, and may include a pushing rod 141 and a driving shaft 142 that corresponds in position to the pushing rod 141. One end of the pushing rod 141 has a guiding surface 143 and is inserted into the seat 11 along the testing direction T, and another end of the pushing rod 141 abuts against the metal sheet 12 along the testing direction T. Moreover, the driving shaft 142 is inserted into the seat 11 along a direction perpendicular to the testing direction T, and the driving shaft 142 abuts against the guiding surface 143 so as to be capable of moving the pushing rod 141 along the testing direction T. It should be noted that the driving shaft 142 can include a spring shown in FIG. 6 for having an auto-adjustment function by an elasticity thereof. Moreover, in other embodiments of the present disclosure not shown in the drawings, the driving shaft 142 can be a screw for having an adjustment function by being rotated.

Accordingly, in an assembling process of the carrier 1 of the present embodiment, the assembling tolerance existing in at least two of the assembling regions 122 of the metal sheet 12 can be effectively reduced through the coarse adjustment members 14 each being independently operable, so that the probe modules 2 can be assembled to the assembling regions 122 that have more uniform height along the testing direction T.

The above description describes the structure of the carrier 1, and the following description describes the structural design of the probe modules 2. As the probe modules 2 in the present embodiment are of the substantially same structure, the following description discloses the structure of just one of the probe modules 2 for the sake of brevity, but the present disclosure is not limited thereto. For example, in other embodiments of the present disclosure not shown in the drawings, the probe modules 2 can be of different structures.

Figure 7:
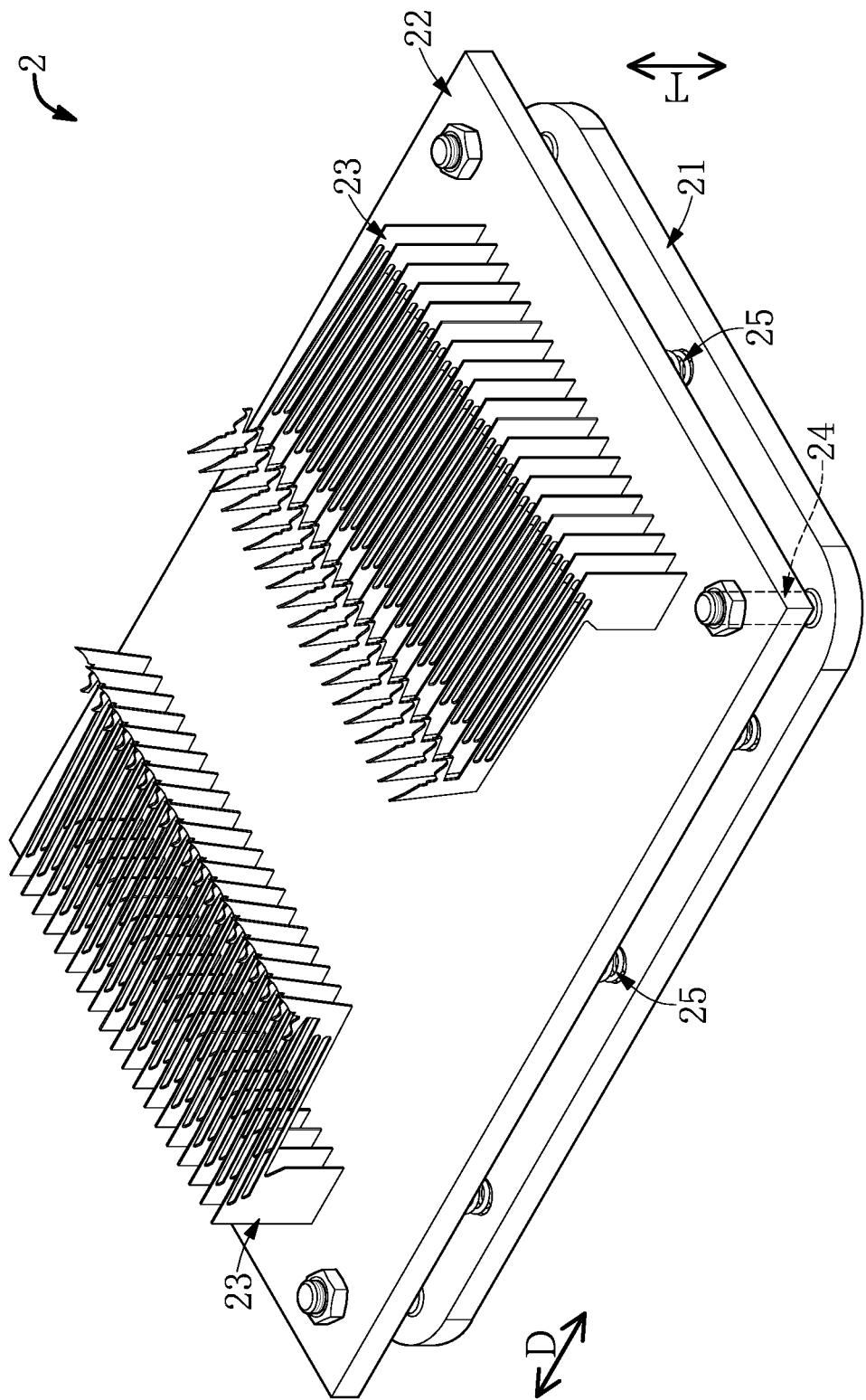
FIG. 7 is a perspective view showing a probe module of FIG. 2.
Figure 8:
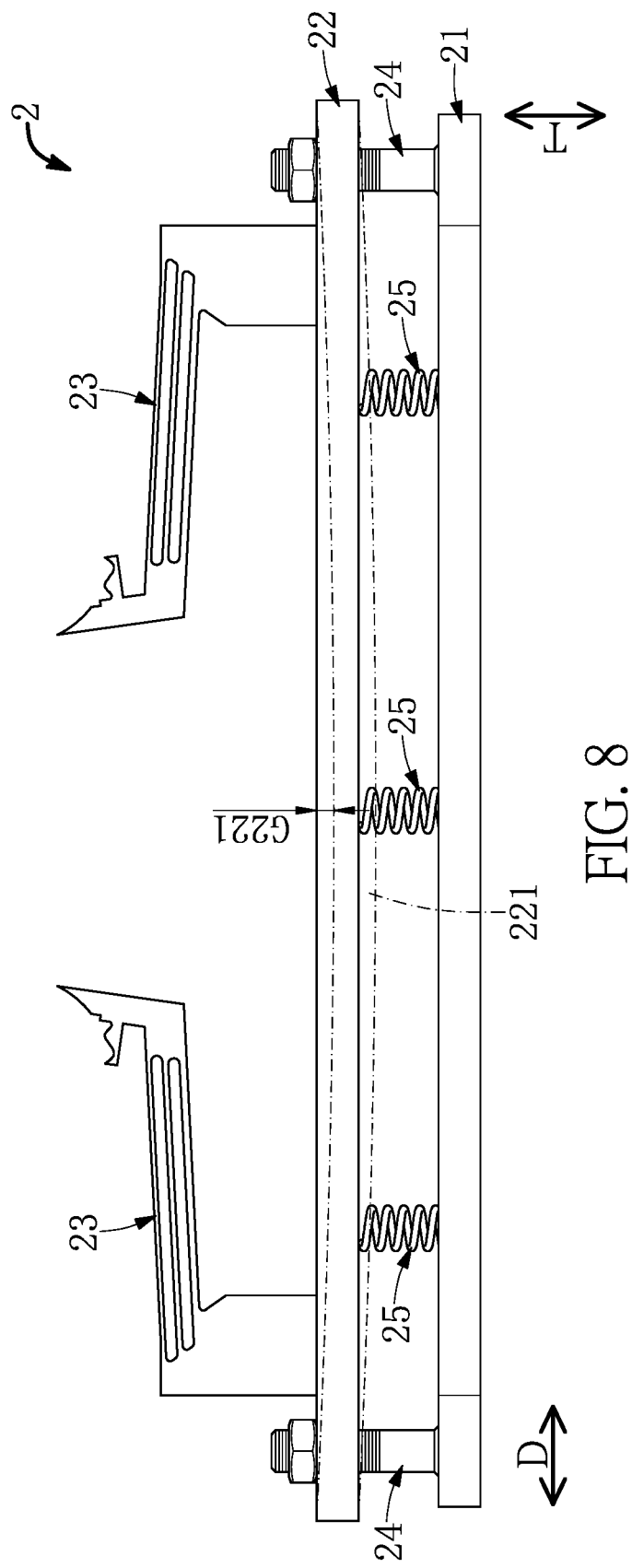
FIG. 8 is a side view of FIG. 7.
Figure 9:
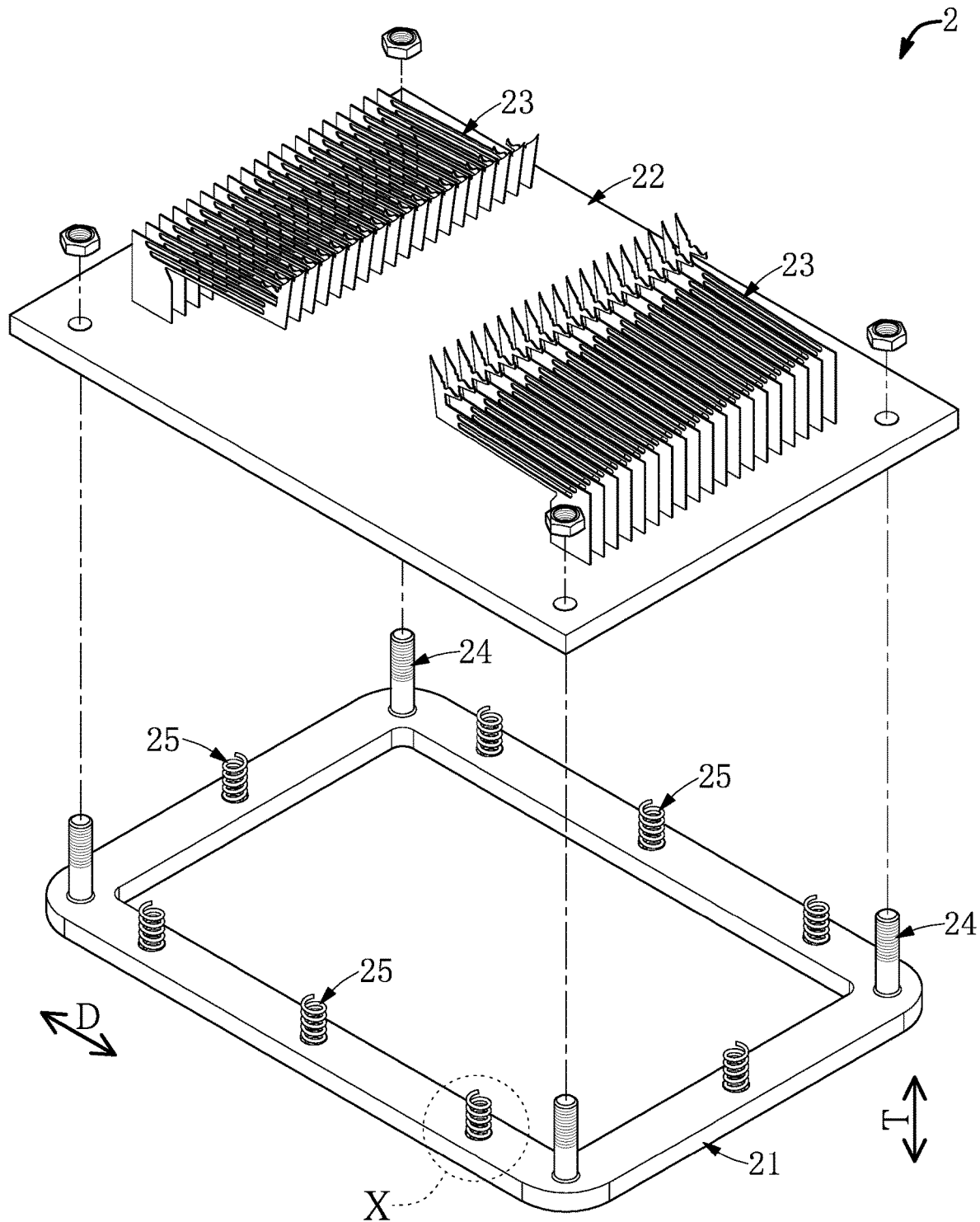
FIG. 9 is an exploded view of FIG. 7.

As shown in FIG. 2, FIG. 7, and FIG. 9, the probe module 2 in the present embodiment includes a supporting board 21, a substrate 22 disposed on the supporting board 21, a plurality of cantilever probes 23 connected to the substrate 22, a restricting mechanism 24 corresponding in position to the supporting board 21 and the substrate 22, and a plurality of fine adjustment members 25 that are spaced apart from each other and that are disposed between the supporting board 21 and the substrate 22, but the present disclosure is not limited thereto. For example, in other embodiments of the present disclosure not shown in the drawings, the restricting mechanism 24 can be omitted or can be replaced by other components.

Specifically, the supporting board 21 is assembled to the carrying surface 121 (e.g., a corresponding one of the assembling regions 122), and the supporting board 21 is used to support the substrate 22 having a thin thickness and easily generating a warpage. The substrate 22 has a non-planar shape and has a difference of warpage G221 along the testing direction T. For example, the substrate 22 includes a warpage portion 221 curved toward the supporting board 21 by the difference of warpage G221.

Moreover, one end of each of the cantilever probes 23 is connected to the substrate 22, and another end of each of the cantilever probes 23 is a needle tip 2321. The cantilever probes 23 in the present embodiment are of the substantially same structure, but in other embodiments of the present disclosure not shown in the drawings, the cantilever probes 23 can be of different structures.

Each of the fine adjustment members 25 is configured to be independently operable along the testing direction T for changing a distance between the supporting board 21 and the substrate 22. The distance between the supporting board 21 and the substrate 22 is limited within a predetermined range through the restricting mechanism 24. For example, the restricting mechanism 24 can include a plurality of screws that are assembled to peripheral regions of the supporting board 21 and the substrate 22, thereby only allowing the substrate 22 to be moved relative to the supporting board 21 along the testing direction T.

Moreover, the fine adjustment members 25 are uniformly distributed on the substrate 22, so that all regions of the substrate 22 can be located in a range that can allow the fine adjustment members 25 to affect or adjust the same. For example, when any one of the regions of the substrate 22 has the warpage portion 221, at least one of the fine adjustment members 25 can correspond in position to the warpage portion 221.

In summary, the substrate 22 is deformable through at least one of the fine adjustment members 25 so as to reduce the difference of warpage G221 along the testing direction T. For example, at least one of the fine adjustment members 25 corresponding in position to the warpage portion 221 can be used to press against and to deform the warpage portion 221 in a direction away from the supporting board 21, thereby effectively reducing the difference of warpage G221 resulting from the warpage portion 221.

As the fine adjustment members 25 in the present embodiment are of the substantially same structure, the following description discloses the structure of just one of the fine adjustment members 25 for the sake of brevity, but the present disclosure is not limited thereto. For example, in other embodiments of the present disclosure not shown in the drawings, the fine adjustment members 25 can be of different structures. Moreover, the fine adjustment members 25 can be adjusted or changed according to design requirements, and the following description just describes the fine adjustment member 25 formed in some possible structures, but the present disclosure is not limited thereto.

Figure 10:
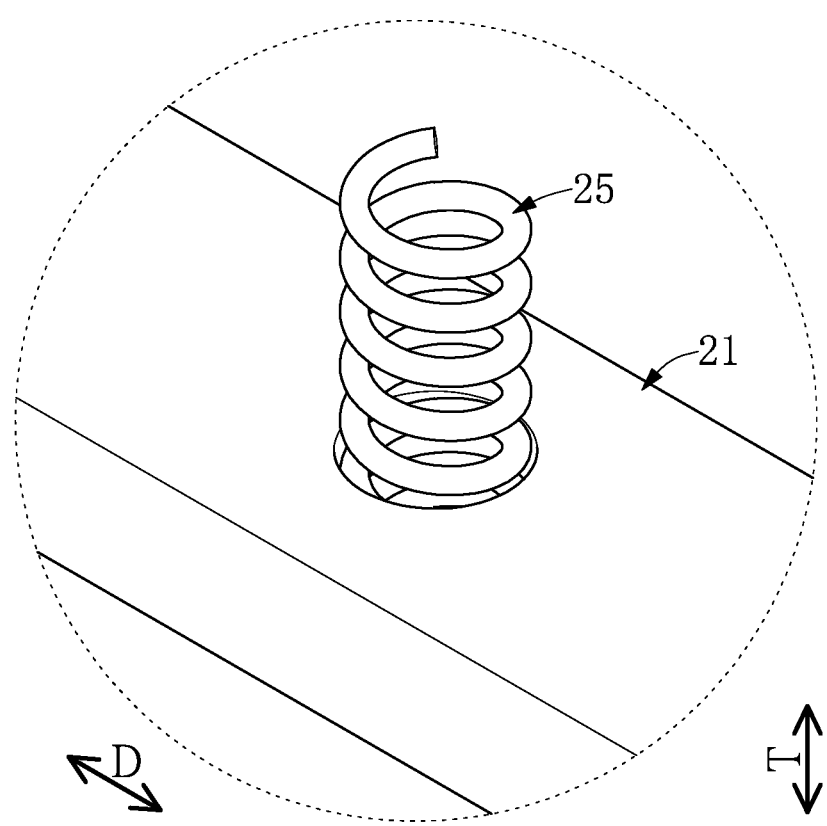
FIG. 10 is an enlarged view of part X of FIG. 9.
Figure 11:
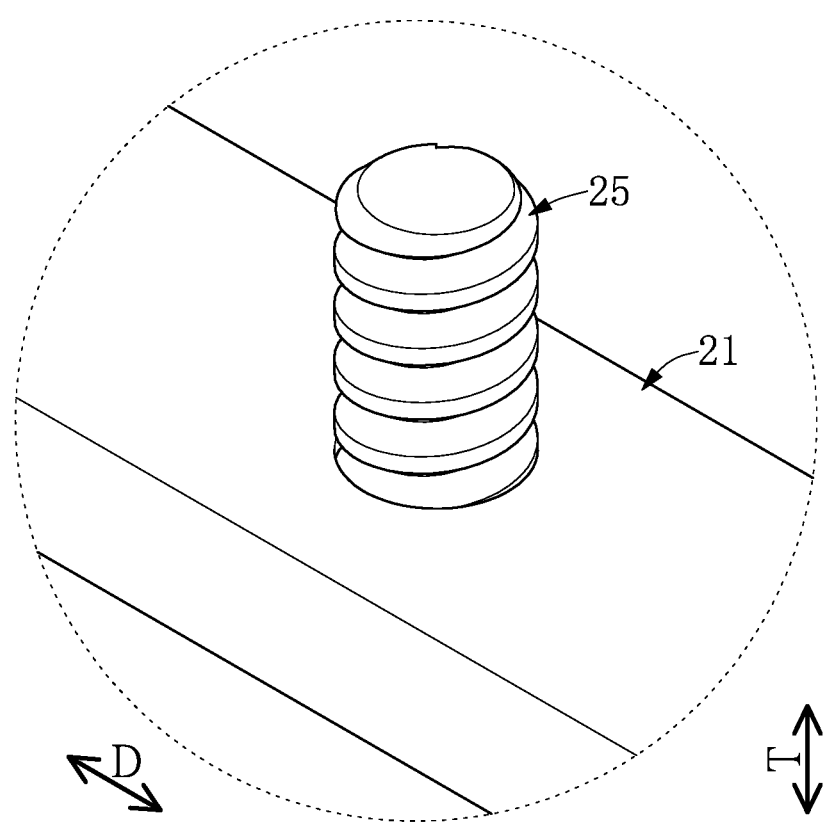
FIG. 11 is a perspective view showing FIG. 10 in another configuration.

As shown in FIG. 9 to FIG. 11, the fine adjustment member 25 can be a single one-piece structure, one end of the fine adjustment member 25 is inserted into the supporting board 21 along the testing direction T, and another end of the fine adjustment member 25 abuts against the substrate 22 along the testing direction T.

Specifically, the fine adjustment member 25 can be a spring shown in FIG. 10 for having an auto-adjustment function by an elasticity thereof (e.g., at least one of the fine adjustment members 25 corresponding in position to the warpage portion 221 is configured to press against the warpage portion 221 by the elasticity thereof), or can be a screw shown in FIG. 11 for having an adjustment function by being rotated (e.g., at least one of the fine adjustment members 25 corresponding in position to the warpage portion 221 is adjustable to press against the warpage portion 221).

Accordingly, the difference of warpage G221 in the present embodiment generated from the non-planar substrate 22 can be effectively reduced through the fine adjustment members 25 of the probe module 2 each being independently operable, so that the cantilever probes 23 can be assembled to the substrate 22 that has more uniform height along the testing direction T.

Specifically, the fine adjustment members 25 of the probe modules 2 in the cantilever probe card 100 provided by the present embodiment can be further cooperated with the coarse adjustment members 14 of the carrier 1, thereby effectively improving co-planarity of the needle tips 2321 of all of the cantilever probes 23 in the cantilever probe card 100. In addition, a size of the fine adjustment member 25 is smaller than that of the coarse adjustment member 14, and a maximum adjustable distance (e.g., 100 μm) of the fine adjustment member 25 along the testing direction T is preferably within a range from 0.5% to 5% of a maximum adjustable distance (e.g., 2000 μm) of the coarse adjustment member 14 along the testing direction T, but the present disclosure is not limited thereto.

Moreover, in the carrier 1 provided by the present embodiment, each of the seat 11 (e.g., the frame 111 and the circuit board 112) and the metal sheet 12 has a circular shape, and each of the supporting board 21 and the substrate 22 in any one of the probe modules 2 has a rectangular shape, but the above shapes can be adjusted or changed according to design requirements and are not limited by the drawings.

Second Embodiment

Figure 12:
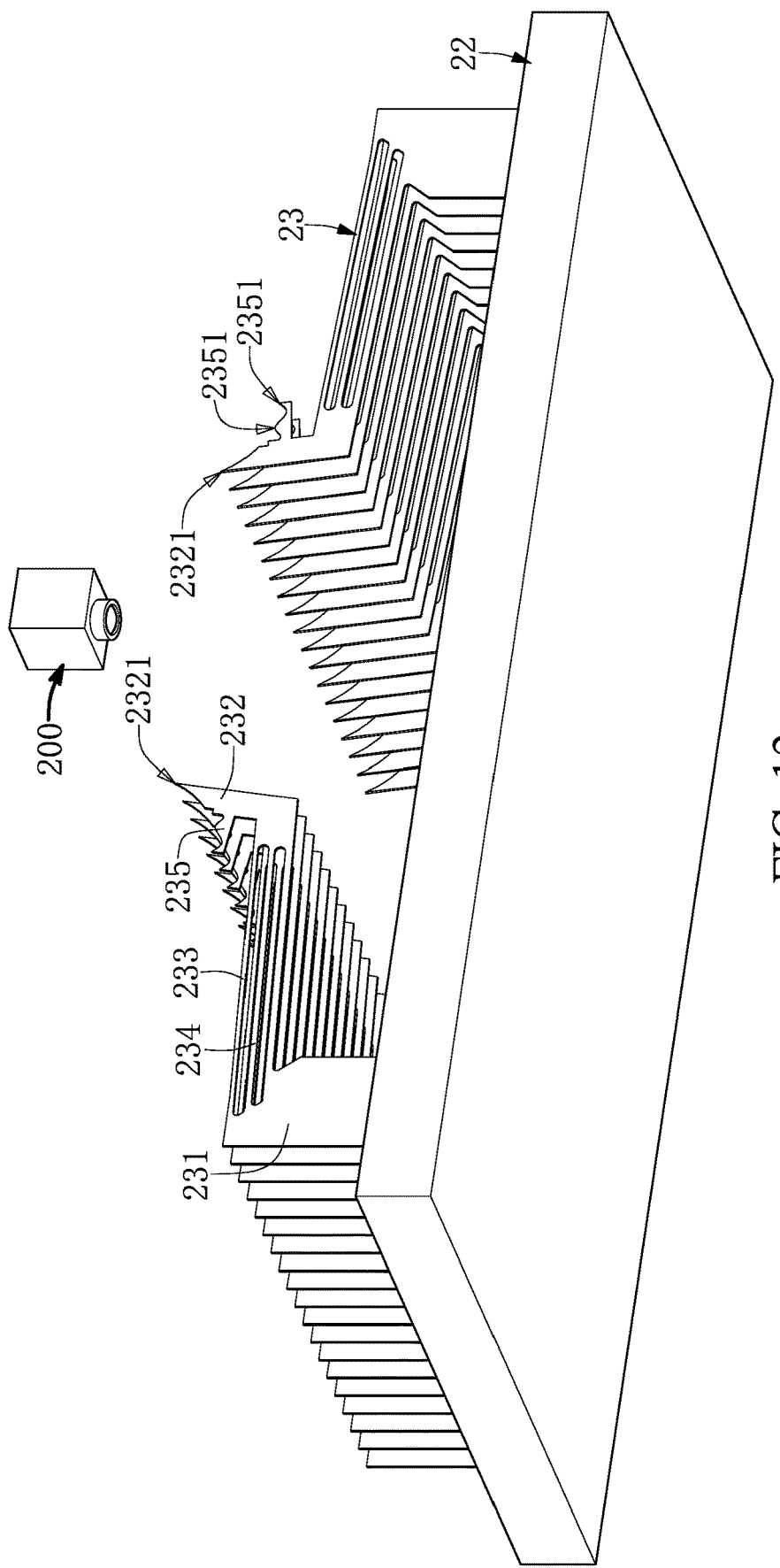
FIG. 12 is a perspective view of the probe module according to a second embodiment of the present disclosure.
Figure 13:
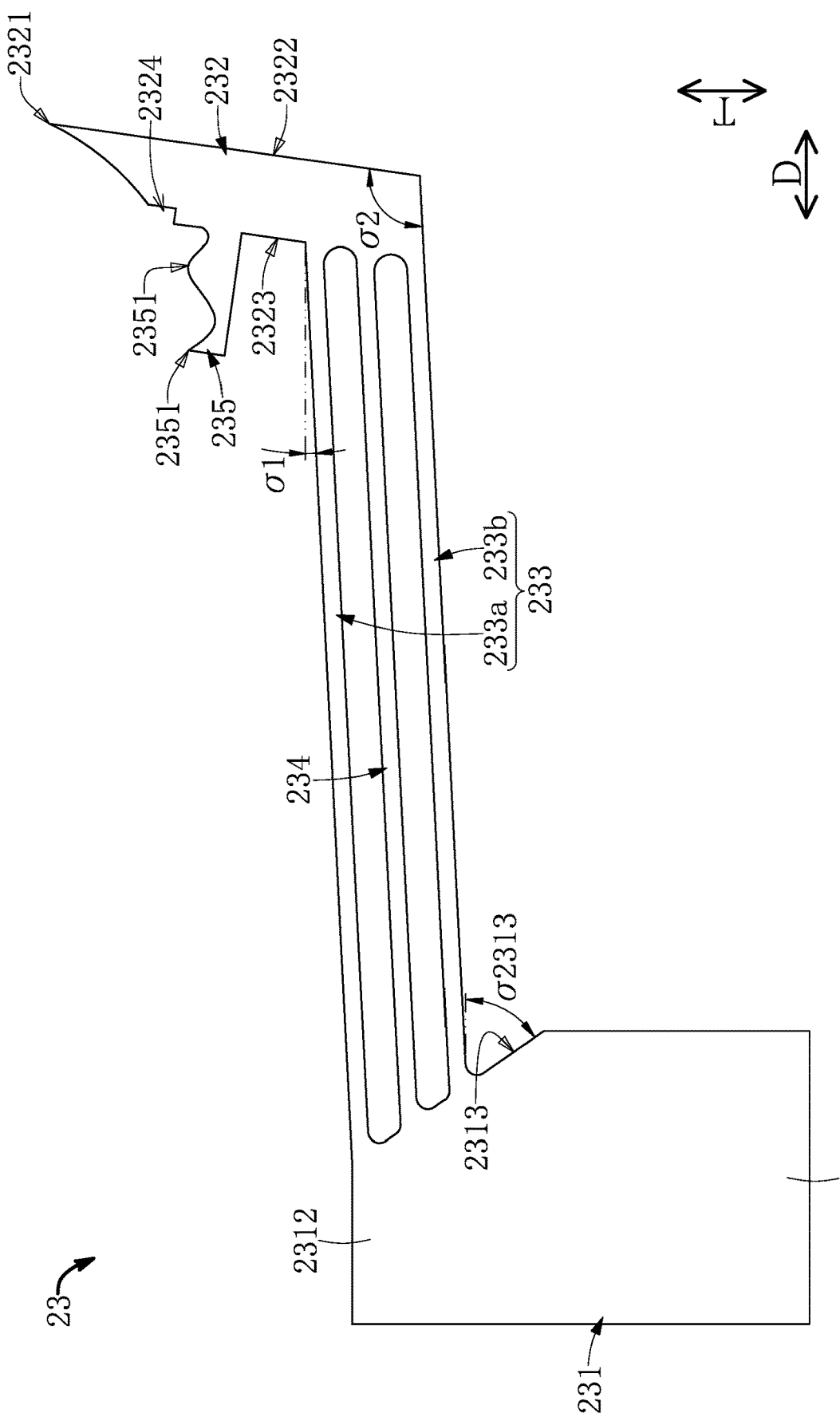
FIG. 13 is a planar view showing a cantilever probe of FIG. 12.
Figure 14:
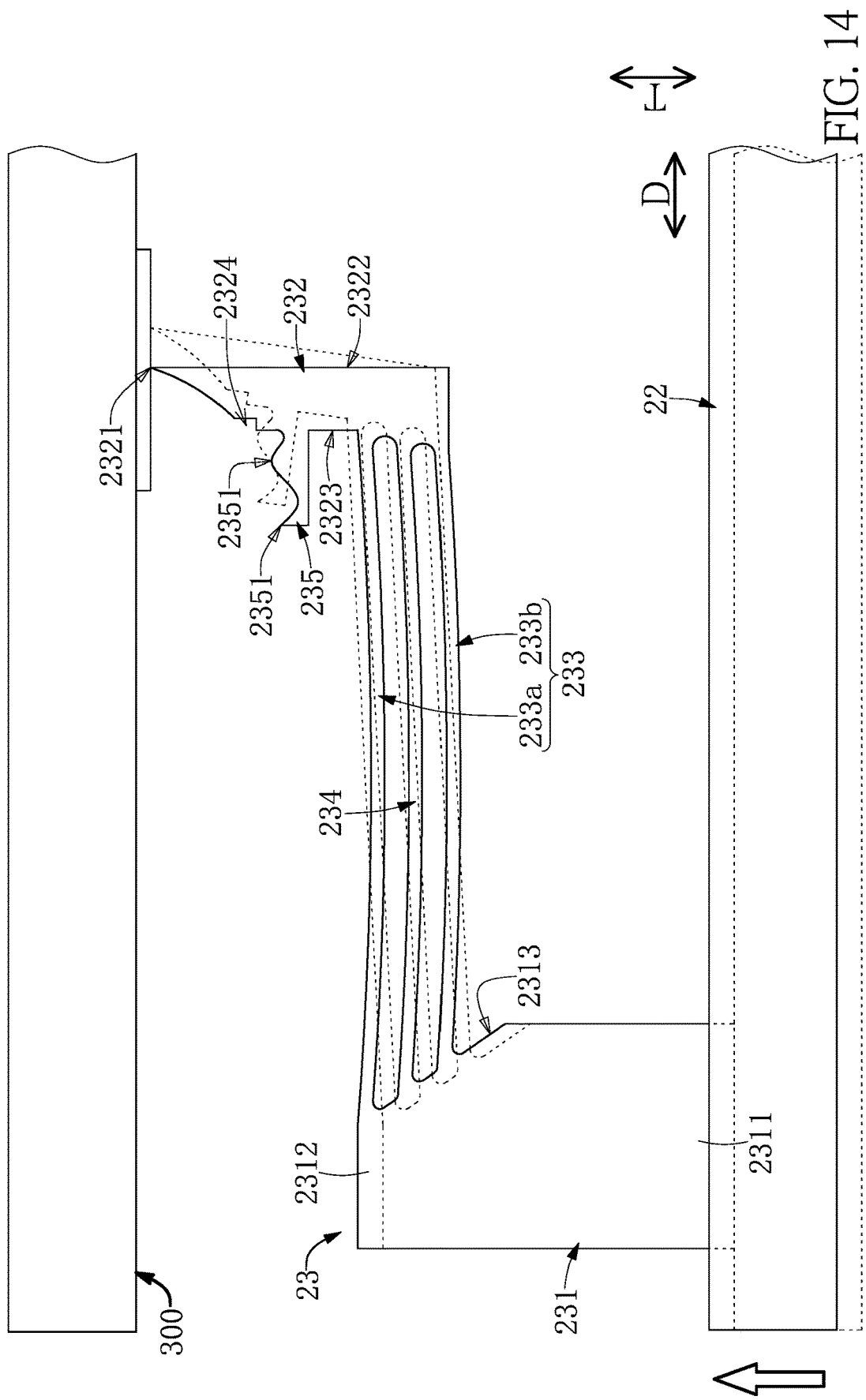
FIG. 14 is a planar view showing the cantilever probe of FIG. 13 used for being abutted against a device under test (DUT)

Referring to FIG. 12 to FIG. 14, a second embodiment of the present disclosure is provided, which is similar to the first embodiment of the present disclosure. For the sake of brevity, descriptions of the same components in the first and second embodiments of the present disclosure will be omitted herein, and the following description only discloses different features between the first and second embodiments.

In the present embodiment, the cantilever probe 23 is integrally formed as a single one-piece structure, and any portion of the cantilever probe 23 has a cross section that has a substantial rectangular shape. The cantilever probe 23 includes a soldering segment 231, a testing segment 232, two outer elastic arms 23 connecting the soldering segment 231 and the testing segment 232, at least one inner elastic arm 234 arranged between the two outer elastic arms 23, and a focusing portion 235 that is connected to the testing segment 232, but the present disclosure is not limited thereto. For example, in other embodiments of the present disclosure not shown in the drawings, the focusing portion 235 and/or the at least one inner elastic arm 234 of the cantilever probe 23 can be omitted.

Specifically, the soldering segment 231 has a first end 2311 and a second end 2312 that is opposite to the first end 2311, and the cantilever probe 23 is soldered onto the substrate 22 through the first end 2311 of the soldering segment 231. Moreover, the testing segment 232 is spaced apart from the soldering segment 231 along an arrangement direction D perpendicular to the testing direction T, and the arrangement direction D in the present embodiment is substantially parallel to a board surface of the substrate 22. The testing segment 232 has a needle tip 2321, an outer edge 2322, and an inner edge 2323 that is opposite to the outer edge 2322. The outer edge 2322 and the inner edge 2323 are respectively arranged at two opposite sides of the needle tip 2321, and a width of the needle tip 2321 along the arrangement direction D is less than or equal to 5 μm.

It should be noted that the second end 2312 of the soldering segment 231 has a layout edge 2313 that is non-parallel to the arrangement direction D (or the substrate 22), and the inner edge 2323 and the layout edge 2313 are spaced apart from each other along the arrangement direction D by different distances therebetween. The layout edge 2313 in the present embodiment is tilted, and the layout edge 2313 and the arrangement direction D have a layout angel σ2313 therebetween that is within a range from 10 degrees to 85 degrees, but the present disclosure is not limited thereto. For example, in other embodiments of the present disclosure not shown in the drawings, the layout edge 2313 can be stepped.

Two ends of each of the two outer elastic arms 233 are respectively connected to the second end 2312 (e.g., the layout edge 2313) of the soldering segment 231 and the inner edge 2323 of the testing segment 232, and the two outer elastic arms 233 are spaced apart from each other along the testing direction T. Specifically, each of the two outer elastic arms 233 in the present embodiment has a straight shape, and a length of each of the two outer elastic aims 233 along the arrangement direction D is at least 150% of a length of the testing segment 232 along the arrangement direction D, but the present disclosure is not limited thereto.

In addition, one of the two outer elastic arms 233 adjacent to the needle tip 2321 is defined as a first outer elastic arm 233a, and another one of the two outer elastic arms 233 is defined as a second outer elastic arm 233b. Moreover, a length of the first outer elastic arm 233a is greater than that of the second outer elastic arm 233b, and the lengths of the first outer elastic arm 233a and the second outer elastic arm 233b are preferable to have a difference therebetween that is within a range from 10 μm to 200 μm, but the present disclosure is not limited thereto.

In the present embodiment, a first angle σ1 between the arrangement direction D and any one of the outer elastic arms 233 is within a range from 0 degrees to 75 degrees, and a second angle σ2 between the testing segment 232 and any one of the outer elastic arms 233 is within a range from 45 degrees to 150 degrees. Moreover, when the needle tip 2321 of each of the cantilever probes 23 abuts against a device under test (DUT) 300 along the testing direction T, the testing segment 232 is rotatable toward a position where the needle tip 2321 is perpendicular to the arrangement direction D.

A quantity of the at least one inner elastic arm 234 in the present embodiment is only one, but in other embodiments of the present disclosure not shown in the drawings, the quantity of the at least one inner elastic arm 234 can be more than one. Two ends of the at least one inner elastic arm 234 are respectively connected to the second end 2312 (e.g., the layout edge 2313) of the soldering segment 231 and the inner edge 2323 of the testing segment 232, and the at least one inner elastic arm 234 is spaced apart from the two outer elastic arms 233 along the testing direction T.

The focusing portion 235 is located between the needle tip 2321 and the two outer elastic arms 233, one end of the focusing portion 235 is connected to the inner edge 2323 of the testing segment 232, and another end of the focusing portion 235 is a free end. In other words, the focusing portion 235 is substantially located in a space (or a corner) surroundingly defined by the inner edge 2323 of the testing segment 232 and one of the two outer elastic aims 233 adjacent to the needle tip 2321.

Specifically, the focusing portion 235 has a plurality of focusing points 2351 arranged on one side thereof (e.g., an upper side of the focusing portion 235 shown in FIG. 13) away from the two outer elastic arms 233. The needle tip 2321 is preferable to be spaced apart from one of the focusing points 2351 adjacent thereto along the arrangement direction D by a predetermined distance that is within a range from 100 μm to 400 μm. Any two of the focusing points 2351 adjacent to each other have a distance therebetween that is different from the predetermined distance.

In summary, the needle tip 2321 and the focusing points 2351 are configured to respectively form observation points in an observation process of a detecting apparatus 200 (e.g., a camera) for obtaining a position of the needle tip 2321. In other words, the position of the needle tip 2321 can be calculated and obtained according to the observation points generated from the focusing points 2351. Accordingly, the cantilever probe 23 of the cantilever probe card 100 provided by the present embodiment is further formed with the focusing portion 235 for being used to effectively reduce the probability that the position of the needle tip 2321 is misjudged by the detecting device 200.

In addition, as shown in FIG. 13, when the needle tip 2321 is arranged in closer proximity to the outer edge 2322 than the inner edge 2323, the inner edge 2323 of the testing segment 232 preferably has a notch 2324 arranged on a position between the needle tip 2321 and an adjacent one of the focusing points 2351, thereby dispersing stress on the testing segment 232 for reducing a probability of breaking of the testing segment 232.

Third Embodiment

Figure 15:
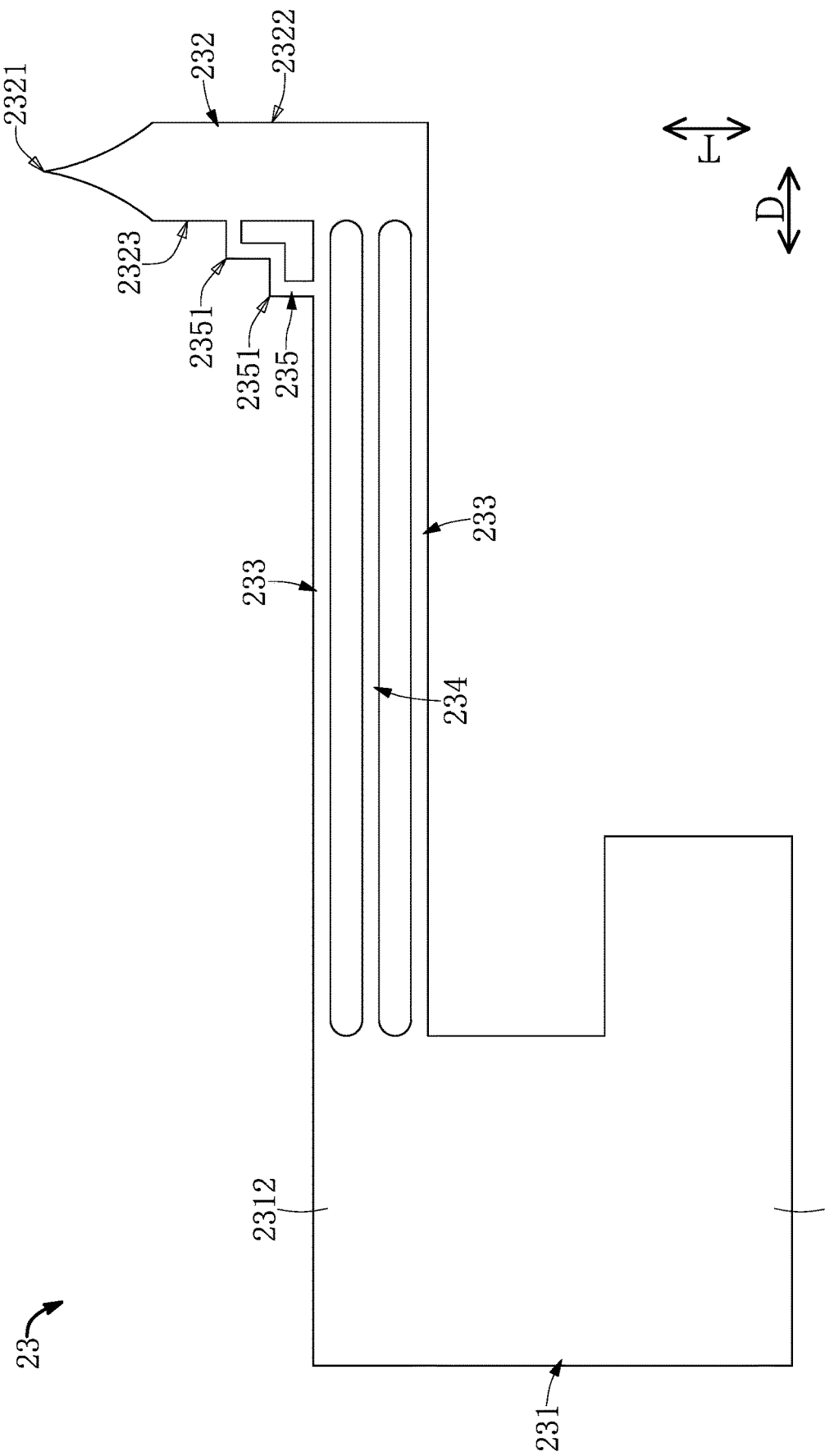
FIG. 15 is a planar view of a cantilever probe according to a third embodiment of the present disclosure.

Referring to FIG. 15, a third embodiment of the present disclosure is provided, which is similar to the first embodiment and the second embodiment of the present disclosure. For the sake of brevity, descriptions of the same components in the first to third embodiments of the present disclosure will be omitted herein, and the following description only discloses different features among the first to third embodiments.

In the present embodiment, the two outer elastic arms 244 can have a same length (e.g., the soldering segment 231 does not have the layout edge 2313), and each of the two outer elastic arms 244 is substantially parallel to the arrangement direction D, and an end of the focusing portion 235 (e.g., a left end of the focusing portion 235 shown in FIG. 15) arranged away from the inner edge 2323 is connected to one of the two outer elastic arms 233 adjacent thereto so as to jointly define an enclosed space, thereby effectively reducing the possible noise generated by the focusing portion 235.

Beneficial Effects of the Embodiments

In conclusion, in an assembling process of the carrier or the cantilever probe card provided by the present disclosure, the assembling tolerance existing in at least two of the assembling regions of the metal sheet can be effectively reduced through the coarse adjustment members each being independently operable, so that the probe modules can be assembled to the assembling regions that have more uniform height along the testing direction.

Moreover, in the probe module or the cantilever probe card provided by the present disclosure, the difference of warpage generated from the non-planar substrate can be effectively reduced through the fine adjustment members each being independently operable, so that the cantilever probes can be assembled to the substrate that has more uniform height along the testing direction.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A cantilever probe card, comprising:
   a carrier having a carrying surface; and
   a plurality of probe modules disposed on the carrying surface of the carrier and spaced apart from each other, wherein each of the probe modules includes:
     a supporting board assembled to the carrying surface;
     a substrate disposed on the supporting board, wherein the substrate has a non-planar shape and has a difference of warpage along a testing direction;
     a plurality of cantilever probes, wherein one end of each of the cantilever probes is connected to the substrate, and another end of each of the cantilever probes is a needle tip; and
     a plurality of fine adjustment members spaced apart from each other and disposed between the supporting board and the substrate, wherein each of the fine adjustment members is configured to be independently operable along the testing direction for changing a distance between the supporting board and the substrate;
   wherein, in each of the probe modules, the substrate is deformable through at least one of the fine adjustment members so as to reduce the difference of warpage of the substrate along the testing direction;
   wherein, in each of the probe modules, the substrate includes a warpage portion curved toward the supporting board by the difference of warpage, and the at least one of the fine adjustment members corresponds in position to the warpage portion and is configured to press against the warpage portion so as to deform the warpage portion in a direction away from the supporting board.

2. The cantilever probe card according to claim 1, wherein each of the probe modules includes a restricting mechanism corresponding in position to the supporting board and the substrate, and the distance between the supporting board and the substrate is limited within a predetermined range through the restricting mechanism.

3. The cantilever probe card according to claim 1, wherein, in each of the probe modules, the at least one of the fine adjustment members corresponding in position to the warpage portion is a spring that presses against the warpage portion by an elasticity thereof.

4. The cantilever probe card according to claim 1, wherein, in each of the probe modules, the at least one of the fine adjustment members corresponding in position to the warpage portion is a screw that is adjustable to press against the warpage portion.

5. The cantilever probe card according to claim 1, wherein, in each of the probe modules, each of the cantilever probes includes:
   a soldering segment having a first end and a second end that is opposite to the first end, wherein the first end is soldered onto the substrate;
   a testing segment spaced apart from the soldering segment along an arrangement direction perpendicular to the testing direction, wherein the testing segment has the needle tip, an outer edge, and an inner edge that is opposite to the outer edge; and
   two outer elastic arms spaced apart from each other and each having two ends respectively connected to the second end of the soldering segment and the inner edge of the testing segment, wherein one of the two outer elastic arms adjacent to the needle tip is defined as a first outer elastic arm, and another one of the two outer elastic arms is defined as a second outer elastic arm, and wherein a length of the first outer elastic arm is greater than that of the second outer elastic arm.

6. The cantilever probe card according to claim 5, wherein, in each of the cantilever probes, the second end of the soldering segment has a layout edge that is non-parallel to the arrangement direction, and the inner edge and the layout edge are spaced apart from each other along the arrangement direction by different distances therebetween.

7. The cantilever probe card according to claim 5, wherein, in each of the cantilever probes, a first angle between the arrangement direction and any one of the two outer elastic arms is within a range from 0 degrees to 75 degrees, and a second angle between the testing segment and any one of the two outer elastic arms is within a range from 45 degrees to 150 degrees, and wherein, when the needle tip of each of the cantilever probes abuts against a device under test (DUT) along the testing direction, the testing segment is rotatable toward a position where the needle tip is perpendicular to the arrangement direction.

8. The cantilever probe card according to claim 5, wherein each of the cantilever probes includes a focusing portion connected to the inner edge and located between the needle tip and the two outer elastic arms, and wherein the focusing portion has a plurality of focusing points arranged on one side thereof away from the two outer elastic arms, and the needle tip and the focusing points are configured to respectively form observation points in an observation process of a detecting apparatus for obtaining a position of the needle tip.

9. A probe module of a cantilever probe card, comprising:
   a supporting board;
   a substrate disposed on the supporting board, wherein the substrate has a non-planar shape and has a difference of warpage along a testing direction;
   a plurality of cantilever probes, wherein one end of each of the cantilever probes is connected to the substrate, and another end of each of the cantilever probes is a free end; and
   a plurality of fine adjustment members spaced apart from each other and disposed between the supporting board and the substrate, wherein each of the fine adjustment members is configured to be independently operable along the testing direction for changing a distance between the supporting board and the substrate;
   wherein the substrate is deformable through at least one of the fine adjustment members so as to reduce the difference of warpage of the substrate along the testing direction;

wherein the substrate includes a warpage portion curved toward the supporting board by the difference of warpage, and the at least one of the fine adjustment members corresponds in position to the warpage portion and is configured to press against the warpage portion so as to deform the warpage portion in a direction away from the supporting board.

10. A probe module of a cantilever probe card, comprising:

a supporting board;

a substrate disposed on the supporting board, wherein the substrate has a non-planar shape and has a difference of warpage along a testing direction;

a plurality of cantilever probes, wherein one end of each of the cantilever probes is connected to the substrate, and another end of each of the cantilever probes is a free end; and a plurality of fine adjustment members spaced apart from each other and disposed between the supporting board and the substrate, wherein each of the fine adjustment members is configured to be independently operable along the testing direction for changing a distance between the supporting board and the substrate;

wherein the substrate is deformable through at least one of the fine adjustment members so as to reduce the difference of warpage of the substrate along the testing direction;

wherein each of the cantilever probes includes:

a soldering segment having a first end and a second end that is opposite to the first end, wherein the first end is soldered onto the substrate;

a testing segment spaced apart from the soldering segment along an arrangement direction perpendicular to the testing direction, wherein the testing segment has the needle tip, an outer edge, and an inner edge that is opposite to the outer edge; and two outer elastic arms spaced apart from each other and each having two ends respectively connected to the second end of the soldering segment and the inner edge of the testing segment, wherein one of the two outer elastic arms adjacent to the needle tip is defined as a first outer elastic arm, and another one of the two outer elastic arms is defined as a second outer elastic arm, and wherein a length of the first outer elastic arm is greater than that of the second outer elastic arm.

* * * * *